United States Patent
Jung et al.

(10) Patent No.: US 10,459,667 B2
(45) Date of Patent: Oct. 29, 2019

(54) NONVOLATILE MEMORY DEVICE

(71) Applicant: SAMSUNG ELECTRONICS CO., LTD., Suwon-si, Gyeonggi-do (KR)

(72) Inventors: Bong-Kil Jung, Seoul (KR); Hyunggon Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 191 days.

(21) Appl. No.: 15/406,840

(22) Filed: Jan. 16, 2017

(65) Prior Publication Data
US 2017/0242586 A1  Aug. 24, 2017

(30) Foreign Application Priority Data

Feb. 23, 2016 (KR) .................. 10-2016-0021109

(51) Int. Cl.
G06F 3/06 (2006.01)
G06F 12/02 (2006.01)
G11C 11/56 (2006.01)
G11C 16/08 (2006.01)
G11C 16/34 (2006.01)
G11C 7/10 (2006.01)

(52) U.S. Cl.
CPC ............ *G06F 3/0688* (2013.01); *G06F 3/061* (2013.01); *G06F 3/0655* (2013.01); *G06F 12/0246* (2013.01); *G11C 11/5628* (2013.01); *G11C 11/5635* (2013.01); *G11C 11/5642* (2013.01); *G11C 16/08* (2013.01); *G11C 16/3459* (2013.01); *G11C 7/106* (2013.01); *G11C 7/1087* (2013.01)

(58) Field of Classification Search
CPC . G11C 11/5628; G11C 16/0483; G11C 16/26; G11C 16/24; G11C 11/5642; G11C 2211/5621; G11C 2211/5641; G11C 7/106; G11C 2213/71; G06F 12/0246
See application file for complete search history.

(56) References Cited

U.S. PATENT DOCUMENTS

| | | |
|---|---|---|
| 7,072,214 B2 | 7/2006 | Jeong et al. |
| 7,221,598 B2 | 5/2007 | Jeong |
| 7,224,624 B2 | 5/2007 | Lee et al. |
| 7,489,544 B2 | 2/2009 | Kim et al. |
| 7,940,567 B2 | 5/2011 | Moon et al. |
| 8,085,607 B2 | 12/2011 | Park et al. |
| 8,194,463 B2 | 6/2012 | Kim et al. |
| 8,605,533 B2 | 12/2013 | Seo |
| 8,812,933 B2 | 8/2014 | Joo et al. |

(Continued)

*Primary Examiner* — Reginald G Bragdon
*Assistant Examiner* — Thanh D Vo
(74) *Attorney, Agent, or Firm* — Volentine, Whitt & Francos, PLLC

(57) ABSTRACT

A nonvolatile memory device includes a nonvolatile memory cell array, where N bits are stored in a single memory cell (N being an integer greater than or equal to 2), and a page buffer circuit electrically connected to the nonvolatile memory cell array. The page buffer circuit includes at least N latches configured to temporarily store data. A data input/output circuit connected to the page buffer circuit receives programmed input data and provides the input data to the page buffer circuit. A control logic controls the page buffer and initializes a target latch value before receiving all input data of a program unit from the data input/output circuit.

19 Claims, 13 Drawing Sheets

(56) References Cited

U.S. PATENT DOCUMENTS

| | | | |
|---|---|---|---|
| 9,086,982 B1* | 7/2015 | Xu | G06F 11/0751 |
| 2009/0216937 A1* | 8/2009 | Yasufuku | G06F 12/0246 |
| | | | 711/103 |
| 2014/0185384 A1 | 7/2014 | Kim et al. | |
| 2017/0116083 A1* | 4/2017 | Park | G06F 11/142 |
| 2017/0220251 A1* | 8/2017 | Park | G06F 3/0604 |

* cited by examiner

NONVOLATILE MEMORY DEVICE

CROSS-REFERENCE TO RELATED APPLICATIONS

This US non-provisional patent application claims priority under 35 USC § 119 to Korean Patent Application No. 10-2016-0021109, filed on Feb. 23, 2016, the entirety of which is hereby incorporated by reference.

BACKGROUND

The present disclosure relates to semiconductor memory devices and, more particularly, to a nonvolatile memory device.

Semiconductor memory devices may include volatile memories such as DRAM and/or SRAM. Semiconductor memory devices may also include nonvolatile memories such as EEPROM, FRAM, PRAM, MRAM, flash memory, and the like. A volatile memory may lose data stored therein at power-off, while a nonvolatile memory may retain data stored therein even at power-off. In particular, a flash memory device may have merits such as a high programming speed, low power consumption, a mass storage capacity, and the like. For this reason, a flash memory system including the flash memory device may be widely used as a data storage medium.

The degree of integration of flash memory has generally increased to maintain user's requirements such as superior performance and price competitiveness. However, in view of fabrication processes, a conventional two-dimensional flash memory has a limitation in increasing the degree of integration. A three-dimensional flash memory has been proposed to overcome the limitation.

SUMMARY

Embodiments of the present disclosure provide a nonvolatile memory device having a nonvolatile memory cell array, where N bits are stored in a single memory cell (N being an integer greater than or equal to 2), and a page buffer circuit electrically connected to the nonvolatile memory cell array. The page buffer circuit includes at least N latches configured to temporarily store data. A data input/output circuit, connected to the page buffer circuit, receives programmed input data and provides the input data to the page buffer circuit. A control logic controls the page buffer and initializes a target latch value before receiving all input data of a program unit from the data input/output circuit.

Embodiments of the present disclosure provide a nonvolatile memory device having a memory cell array including a plurality of memory cells. A page buffer circuit temporarily stores data received from a memory controller and transfers the temporarily stored data to the memory cell array. The page buffer circuit includes a cache latch, a first latch, and a second latch. A control circuit controls operations of the memory cell array and the page buffer circuit. The control circuit controls the page buffer circuit to transfer first data, corresponding to a first programming command received from the memory controller, stored in the cache latch to the first latch while the control circuit receives a second programming command from the memory controller.

Embodiments of the present disclosure provide a nonvolatile memory device having a memory cell array comprising a plurality of memory cells. A page buffer circuit temporarily stores data received data from a memory controller and transfers the temporarily stored data to the memory cell array. The page buffer circuit includes a cache latch, a first latch, and a second latch. A control circuit controls operations of the memory cell array and the page buffer circuit. The control circuit controls the page buffer circuit to transfer a first portion of first data, which first data corresponds to a first programming command received from the memory controller, stored in the cache latch to the first latch while the cache latch receives a second portion of the first data from a memory controller.

BRIEF DESCRIPTION OF THE DRAWINGS

The forgoing and other features of the disclosure will be described below in more detail with reference to the accompanying drawings of non-limiting example embodiments of disclosure in which like reference characters refer to like parts throughout the different views. The drawings are not necessarily to scale, emphasis instead being placed upon illustrating principles of the disclosure. In the drawings.

DETAILED DESCRIPTION

Example embodiments will now be described more fully with reference to the accompanying drawings, in which some example embodiments are shown.

Figure 1:
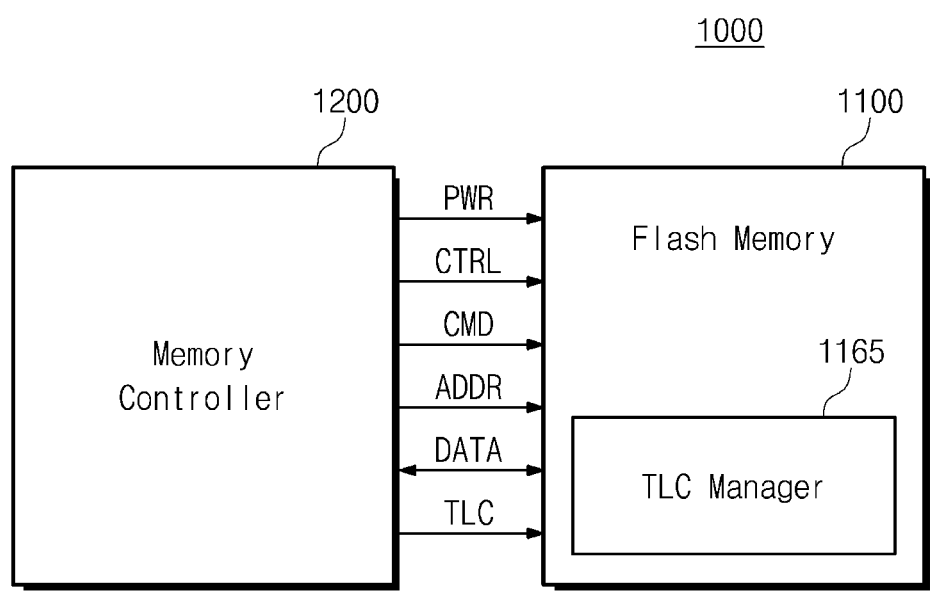
FIG. 1 is a block diagram of a flash memory system according to example embodiments of disclosure.

FIG. 1 is a block diagram of a flash memory system 1000 according to example embodiments of the disclosure. Referring to FIG. 1, the flash memory system 1000 may include a flash memory device 1100 and a memory controller 1200. The flash memory system 1000 may include any flash memory-based data storage medium such as a memory card, a universal serial bus (USB) memory, and a solid state drive (SSD).

The flash memory device 1100 may perform erase, write, and read operations under the control of the memory controller 1200. For this, the flash memory device 1100 may receive a command CMD, an address ADDR, data DATA, and target latch command TLC via input/output lines. The target latch command TLC may be a target latch address.

The flash memory device 1100 may receive power PWR via a power line and a control signal CTRL via a control line. The control signal CTRL may include a command latch enable signal CLE, an address latch enable signal ALE, a chip enable signal nCE, a write enable signal nWE, a read enable signal nRE, and so on.

The flash memory device 1100 may include a target latch manager (TLC manager) 1165.

The target latch manager 1165 may receive a target latch command corresponding to first data and initialize a target latch while the first data is input. The target latch manager 1165 may adjust an operation to transmit the first data to the target latch while the first data is input.

In example embodiments, the target latch manager 1165 may be included in the memory controller 1200. In this case, the target latch manager 1165 may be managed by a flash translation layer (FTL). The flash memory system 1000 in FIG. 1 may reduce program operation time using the target latch manager 1165 to improve performance of the nonvolatile memory device 1100.

Figure 2:
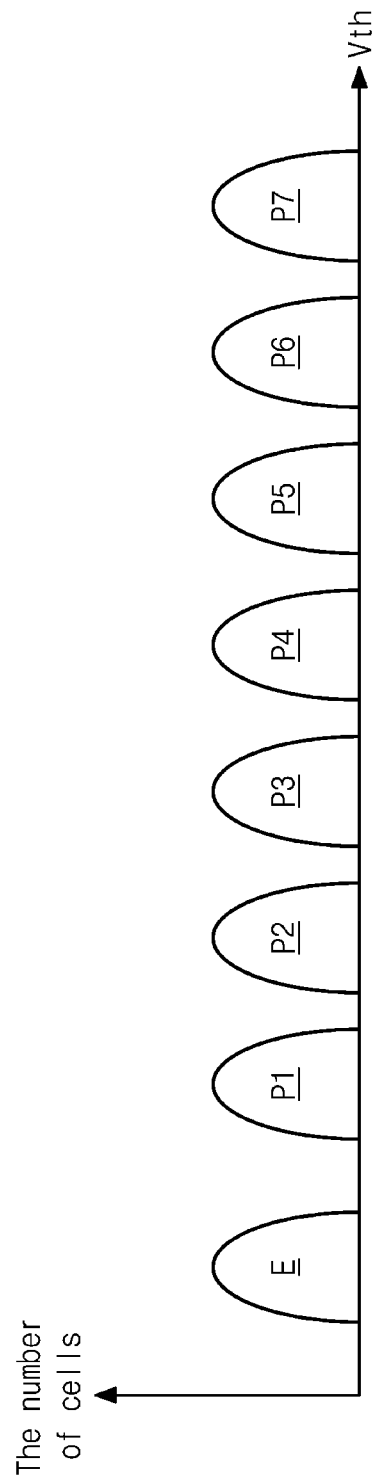
FIG. 2 illustrates a threshold voltage distribution of a program state and an erase state after a program operation of a 3-bit MLC nonvolatile memory device is performed.

FIG. 2 illustrates a threshold voltage distribution of a program state and an erase state after a program operation on a 3-bit MLC nonvolatile memory device is performed.

In the case of a 3-bit multi-level cell (MLC), a nonvolatile memory device may sequentially receive least significant bit (LSB) data, center significant bit (CSB) data, and most significant bit (MSB) data and perform a program operation of 3-bit data on a single memory cell. In case of an MLC flash memory, one of $2^k$ threshold voltages needs to be generated in a single memory cell in order to program k bits into the single memory cell.

Due to a minute difference in electrical characteristics between a plurality of memory cells, each of the threshold voltages of memory cells into which the same data is programmed respectively may form a threshold voltage distribution of fixed range. The threshold voltage distributions may correspond to $2^k$ data values that may be generated by the k bits, respectively. In case of a 3-bit MLC, seven threshold voltage distributions P1 to P7 of a program state and one threshold voltage distribution E of an erase state are formed, as shown in FIG. 2. A dispersion shown in FIG. 2 is an ideal dispersion in which there is no overlapping between state distributions and read voltages are different at the respective threshold distributions.

Figure 3:
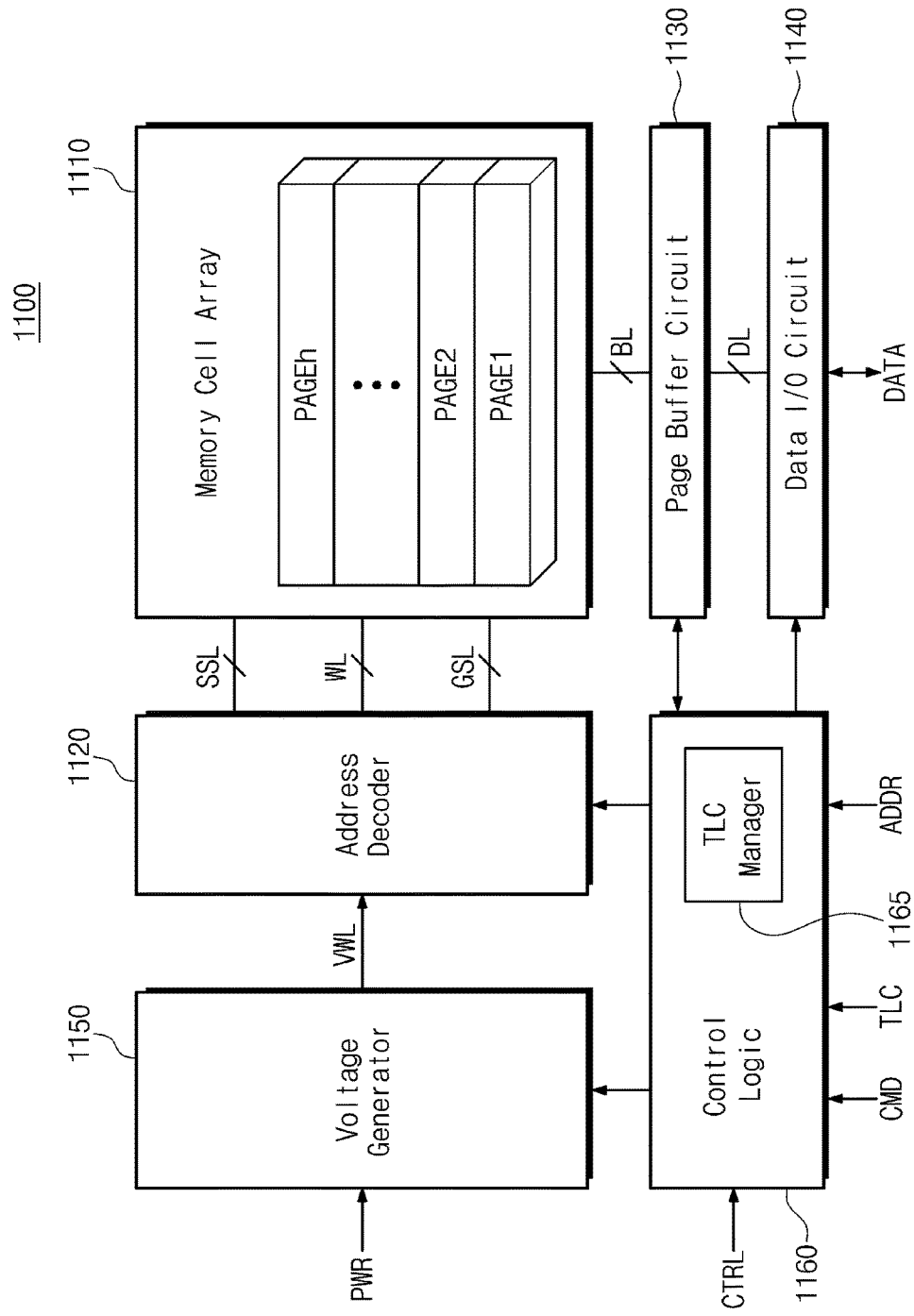
FIG. 3 is a block diagram of a nonvolatile memory device in FIG. 1.

FIG. 3 is an exemplary block diagram of a nonvolatile memory device 1100 in FIG. 1. Referring to FIG. 3, the nonvolatile memory device 1100 includes a memory cell array 1110, an address decoder 1120, a page buffer circuit 1130, a data input/output circuit 1140, a voltage generator 1150, and a control logic 1160 configured to control the overall operation of the nonvolatile memory device 1100. The control logic 1160 includes a target latch manager 1165 that may adjust program operation time.

The memory cell array 1110 may include a plurality of memory blocks. In FIG. 3, one exemplary memory block is shown. Each of the memory blocks may include a plurality of physical pages PAGE1~PAGEh. The term "physical page" refers to a collection of memory cells connected to a single wordline. The memory cell array 1110 includes a two-dimensional structure of a memory cell or a three-dimensional structure where memory cells are vertically stacked over a substrate. A single page is a unit of programming and may be, for example, a unit of 16 Kbytes.

The address decoder 1120 is connected to the memory cell array 1110 via selection lines SSL, GSL, and wordlines WL. During a program or read operation, the address decoder 1120 may receive an address ADDR, via control logic 1160, and select a certain wordline WL. The page buffer circuit 1130 is connected to the memory cell array 1110 via bitlines BL. The page buffer circuit 1130 may temporarily store data to be programmed into a selected page or data read from a selected page. The page buffer circuit 1130 may include a plurality of latches. For example, the page buffer circuit 1130 may include a cache latch, an LSB latch, a CSB latch, an MSB latch, and a sense latch. The cache latch may temporarily store data when the data is input into the nonvolatile memory device 1100 or output from the nonvolatile memory device 1100. The sense latch senses data of a memory cell during a read operation. The LSB latch stores LSB data during a program operation, the MSB latch stores MSB data during a program operation, and the CSB latch stores CSB data during a program operation. Each of the LSB latch, the CSB latch, and the MSB latch respectively corresponding to the data may be a target latch.

The data input/output circuit 1140 is connected to the page buffer circuit 1130 via data lines DL and is externally connected to the memory controller 1200 (in FIG. 1) via an input/output line I/O. The data input/output circuit 1140 receives program data, DATA, from the memory controller 1200 and transmits the received program data to a page buffer during a program operation. The data input/output circuit 1140 provides read data, DATA, received from the page buffer 1130 to the memory controller 1200 during a read operation.

The voltage generator 1150 receives a power signal PWR from the memory controller 1200 and generates a wordline voltage VWL required to read or write data. The wordline voltage VWL is supplied to a specific wordline WL via the wordline decoder 1120. The voltage generator generates a program voltage Vpgm, a read voltage Vread, a verify voltage Vref, and the like. The voltage generator 1150 supplies a generated voltage to a specific wordline WL of a memory cell array via the address decoder 1120.

The control logic 1160 controls the overall operation of the nonvolatile memory device. The control logic 1160 may control operations such as program, read, and erase operations using a command CMD, an address ADDR, and a control signal CTRL. For example, during a program operation, the control logic 1160 may control the address decoder 1120 such that a read or verify voltage is supplied to a selected wordline WL and may control the page buffer circuit 1130 and the data input/output circuit 1140 such that program data is provided to a selected page.

The control logic 1160 may include a target latch manager 1165. The target latch manager 1165 receives a target latch command TLC during a multi-bit program operation. In example embodiments, the target latch manager 1165 may initialize a target latch with reference to a program command or a column address and a row address without receiving a separate target latch command. The target latch manager 1165 may classify a type of data as a combination of the column address and the row address to initialize a target latch corresponding to the type of data. The target latch manager 1165 may be implemented with a logic circuit or implemented in software.

The target latch manager 1165 initializes a target latch value corresponding to first data according to the first target latch command while the data input/output circuit 1140 receives the first data. The target latch manager 1165 initializes a target latch value corresponding to second data according to a second target latch command while the data input/output circuit 1140 receives the second data.

The target latch manager 1165 initializes a target latch value corresponding to third data according to a third target latch command while the data input/output circuit 1140 receives the third data.

The target latch manager 1165 may cause each of the first to third data to be transmitted to a corresponding target latch before all of the first to third data are supplied to the data input/output circuit 1140.

In case of a 3-bit MLC memory device, the first data may refer to least significant bit (LSB) data, the second data may refer to center significant bit (CSB) data, and the third data may refer to most significant bit (MSB) data.

The target latch manager 1165 initializes a first target latch value when a size of first data, which is a unit of programming, is 16 Kbytes and the first data is received with 15.8 Kbytes. Thus, the target latch manager 1165 does not wait for completion of provision of the first data (Din). The target latch manager 1165 may reduce program operation time by initializing a target latch within a period in which the first data is provided. The target latch manager 1165 may cause the first data to be transmitted to a corresponding target latch within a period in which the first data is provided. Thus, a period in which data is input to the data input/output circuit 1140 and a period in which the data input/output circuit 1140 transmits the data to the target latch may overlap each other during a program operation. For example, when 50 percent or more of program unit data is provided to the data input/output circuit 1140, the data input/output circuit 1140 may transmit the received data to a corresponding target latch.

Figure 4:
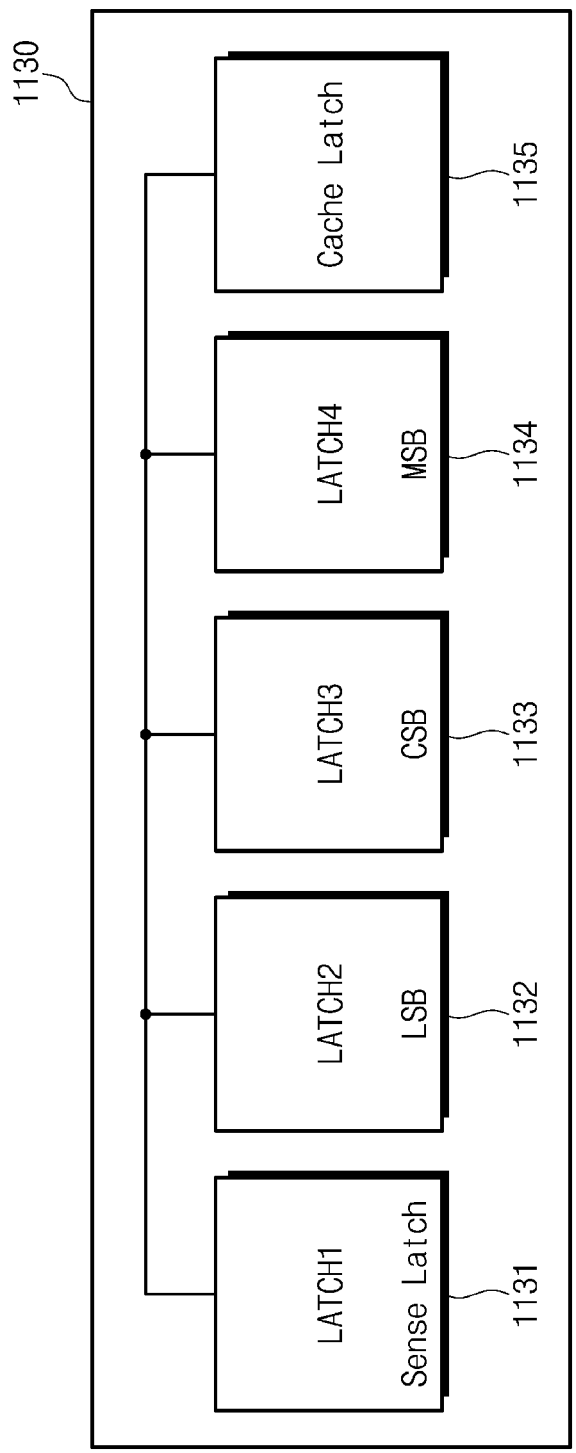
FIG. 4 is a detailed block diagram of a page buffer circuit in FIG. 3.

FIG. 4 is a detailed block diagram of the page buffer circuit 1130 in FIG. 3. As illustrated, the page buffer circuit 1130 includes a plurality of latches.

For example, the page buffer circuit 1130 may include a cache latch 1135, an LSB latch 1132 (i.e., LATCH2), a CSB latch 1133 (i.e., LATCH3), an MSB latch 1134 (i.e., LATCH4), and a sense latch 1131 (i.e., LATCH1), which are electrically connected to each other. The cache latch 1135 may temporarily store data when the data is input/output to/from the nonvolatile memory device 1100 (Din/out). The sense latch 1131 may sense data of a memory cell during a read operation. The LSB latch 1132 may store LSB data during a program operation, the MSB latch 1144 may store MSB data during a program operation, and the CSB latch 1133 may store CSB data during a program operation. A target latch may include the LSB latch 1132, the CSB latch 1133, and the MSB latch 1134.

For example, the first data may be LSB data corresponding to the LSB latch 1132, the second data may be CSB data corresponding to the CSB latch 1133, and the third data may be MSB data corresponding to the MSB latch 1134.

Referring to FIGS. 3 and 4, the target latch manager 1165 determines to transmit original data provided to the data input/output circuit 1140 to a target latch corresponding to the data during a program operation. Thus, the target latch manager 1154 may control initialization of the target latch and data transmission to the target latch.

The target latch manager 1165 may initialize: (1) the LSB latch 1132, which is a target latch corresponding to input data, considering a size of data and (2) data input time or the like while the first data is input to the data input/output circuit 1140. The target latch manager 1165 may cause the first data to be transmitted to the initialized LSB latch 1132 while the first data is input to the data input/output circuit 1140. Alternatively, the target latch manager 1165 may cause the first data to be transmitted to the LSB latch 1132 after all first data are input to the data input/output circuit 1140.

For example, when the first data is a total 16 Kbytes, the target latch manager 1165 may initialize a target latch value while receiving data. And the target latch manager 1165 may determine a point in time at which first data is transmitted to an initialized latch.

The target latch manager 1165 may initialize the cache latch 1135 in response to a program command Thus, the target latch manager 1165 may initialize the cache latch 1135 after a target latch value is initialized.

Figure 5:
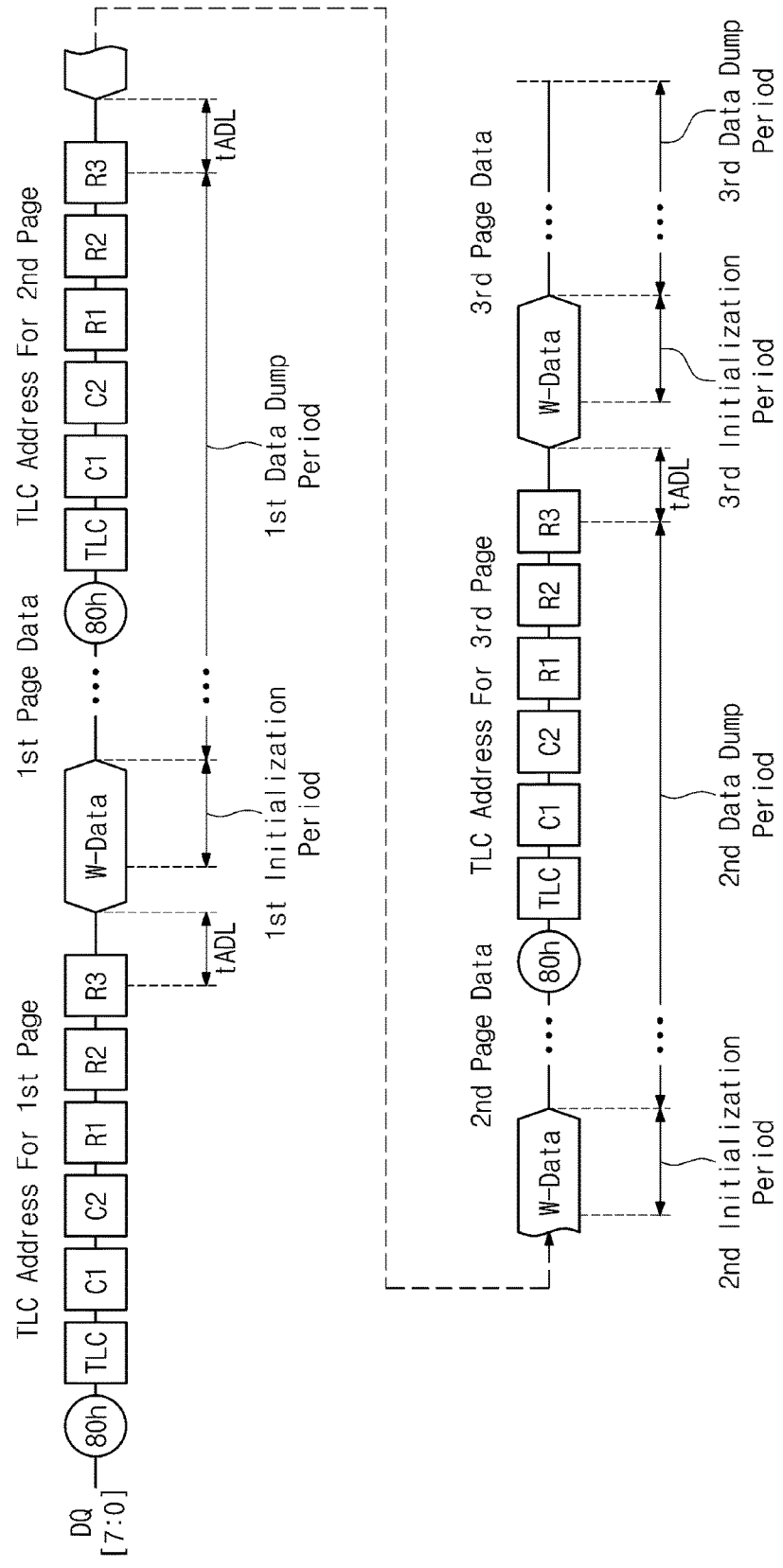
FIG. 5 illustrates one embodiment of a timing diagram of an operation that a target latch command performs during a program operation.

FIG. 5 illustrates one embodiment of a timing diagram of an operation that a target latch command performs during a program operation. Referring to FIG. 5, a data strobe DQ includes eight pins [7:0].

During a program operation, a program command 80*h* is provided to a nonvolatile memory 1100 and target latch commands TLC are sequentially provided to the nonvolatile memory 1100. And column addresses C1 and C2 and row addresses R1, R2, and R3 are provided to the nonvolatile memory device 1100. Finally, program data W-data is provided to the nonvolatile memory device 1100.

The target latch command TLC may be provided ahead of the program data W-data. Accordingly, the target latch command TLC may be provided between the program command 80*h* and the program data W-data. Address to data loading time tADL is a time from inputting a row address to inputting data. In example embodiments, the target latch command TLC may not be a command separate from the program command 80*h* but a command included in the program command 80*h*. That is, the target latch command TLC and the program command 80*h* may be combined as a single command. Alternatively, the target latch manager 1165 may initialize a target latch, in an initialization period, corresponding to data in response to the program command 80*h* before all program unit data are input. The target latch manager 1165 may initialize the target latch value with reference to the column addresses C1 and C2 and the row address R1, R2, and R3 corresponding to input data without a separate command before receiving all input data. For example, the target latch manager 1165 may combine the column addresses C1 and C2 and the row address R1, R2, and R3 to determine a type of input data and initialize, in the initialization period, a target latch corresponding to the input data before receiving all input data.

Referring to FIGS. 3 to 5, the nonvolatile memory device 1100 may sequentially receive the program command 80*h*, the target latch command TLC, and the column addresses C1 and C2 and the row addresses R1, R2, and R3 corresponding a first page from the memory controller 1200. However, the order of the commands and the addresses are not limited to that in FIG. 5. When the first page is an LSB page, LSB data that is first data is provided to the data input/output circuit 1140 after the row addresses R1, R2, and R3 are provided to the nonvolatile memory device 1100. The cache latch 1135 is initialized in response to the program command 80*h*. That is, the cache latch 1135 is initialized before the LSB data is completely provided. The target latch manager 1165 initializes, in the first initialization period, the LSB latch 1132, which is a target latch, considering a size of input data before LSB data of a single page are all input. Thus, the target latch manager 1165 may reduce program time by initializing the LSB latch 1132, in the first initialization period, while the first data is input. The cache latch 1135 receives all the first data and then transmits the received first data to the LSB latch 1132 in the first data dump period. Thus, a period in which a second page program command 80$h$ is provided and a first data transmission period, in which the first data is transmitted from the cache latch 1135 to the LSB latch 1132, overlap each other. The nonvolatile memory device 1100 receives the second page program command 80$h$ to perform a second page program operation. The nonvolatile memory device 1100 sequentially receives the target latch command TLC and the column addresses C1 and C2 and the row addresses R1, R2, and R3 corresponding to a second page. However, the order of the commands and addresses is not limited to that in FIG. 5. The cache latch 1135 is initialized in response to the program command 80$h$ or the target latch command TLC. Thus, the cache latch 1135 may be initialized in a period in which second data addresses are provided and a period (i.e., the first data dump period) in which the first data is transmitted from the cache latch 1135 to the LSB latch 1132. Similar to the above, the CSB latch 1133 is initialized after an address is provided.

More specifically, the nonvolatile memory device 1100 may sequentially receive the program command 80$h$, the target latch command TLC, and the column addresses C1 and C2 and the row addresses R1, R2, and R3 corresponding a second page from the memory controller 1200. However, the order of the commands and the addresses are not limited to that in FIG. 5. When the second page is a CSB page, CSB data that is second data is provided to the data input/output circuit 1140 after the row addresses R1, R2, and R3 are provided to the nonvolatile memory device 1100. The cache latch 1135 is initialized in response to the program command 80$h$. That is, the cache latch 1135 is initialized before the CSB data is completely provided. The target latch manager 1165 initializes, in the second initialization period, the CSB latch 1133, which is a target latch, considering a size of input data before CSB data of a single page are all input. Thus, the target latch manager 1165 may reduce program time by initializing the CSB latch 1133, in the second initialization period, while the second data is input. The cache latch 1135 receives all the second data and then transmits the received second data to the CSB latch 1133 in the second data dump period. Thus, a period in which a third page program command 80$h$ is provided and a second data transmission period, in which the second data is transmitted from the cache latch 1135 to the CSB latch 1133, overlap each other. The nonvolatile memory device 1100 receives the third page program command 80$h$ to perform a third page program operation. The nonvolatile memory device 1100 sequentially receives the target latch command TLC and the column addresses C1 and C2 and the row addresses R1, R2, and R3 corresponding to a third page. However, the order of the commands and addresses is not limited to that in FIG. 5. The cache latch 1135 is initialized in response to the program command 80$h$ or the target latch command TLC. Thus, the cache latch 1135 may be initialized in a period in which third data addresses are provided and a period (i.e., the second data dump period) in which the second data is transmitted from the cache latch 1135 to the CSB latch 1133. Similar to the above, the MSB latch 1134 is initialized after an address is provided.

More specifically, the nonvolatile memory device 1100 may sequentially receive the program command 80$h$, the target latch command TLC, and the column addresses C1 and C2 and the row addresses R1, R2, and R3 corresponding a third page from the memory controller 1200. However, the order of the commands and the addresses are not limited to that in FIG. 5. When the third page is an MSB page, MSB data that is third data is provided to the data input/output circuit 1140 after the row addresses R1, R2, and R3 are provided to the nonvolatile memory device 1100. The cache latch 1135 is initialized in response to the program command 80$h$. That is, the cache latch 1135 is initialized before the MSB data is completely provided. The target latch manager 1165 initializes, in the third initialization period, the MSB latch 1132, which is a target latch, considering a size of input data before MSB data of a single page are all input. Thus, the target latch manager 1165 may reduce program time by initializing the MSB latch 1134, in the third initialization period, while the third data is input. The cache latch 1135 receives all the third data and then transmits the received third data to the MSB latch 1134 in the third data dump period.

Figure 6:
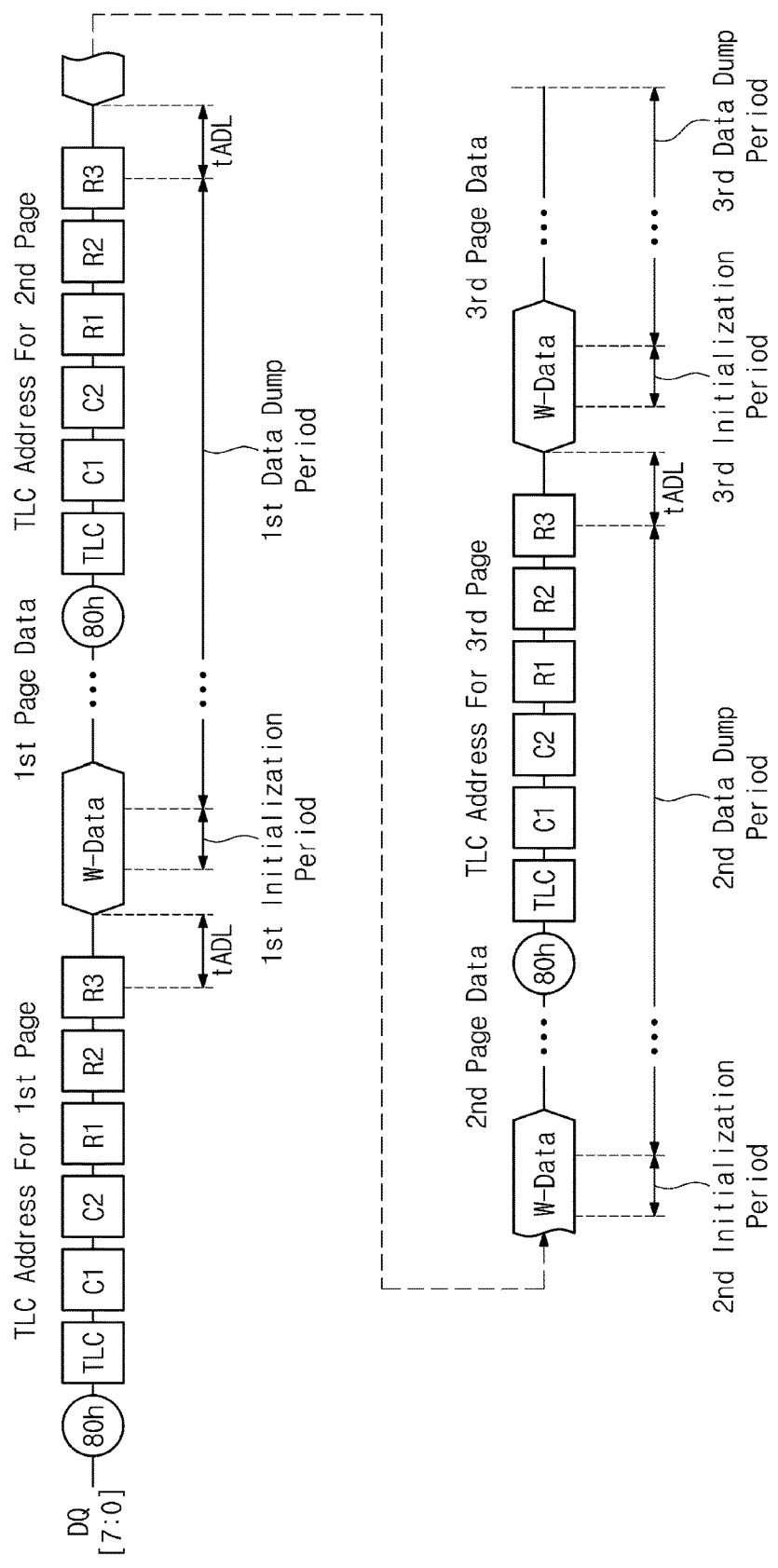
FIG. 6 illustrates another embodiment of a timing diagram of an operation that a target latch command performs during a program operation.

FIG. 6 illustrates another embodiment of a timing diagram of an operation that a target latch command performs during a program operation. Referring to FIGS. 5 and 6, a target latch command TLC may be provided ahead of program data W-data. In FIG. 6, sections different from FIG. 5 will be extensively described to avoid duplicate description.

During a program operation, a program command 80$h$ is provided to the nonvolatile memory 1100 and then target latch commands TLC are sequentially provided to the nonvolatile memory 1100. And column addresses C1 and C2 and row addresses R1, R2, and R3 are provided to the nonvolatile memory 1100. Finally, the program data W-data is provided to the nonvolatile memory 1100.

The target latch command TLC may be provided ahead of the program data W-data. Accordingly, the target latch command TLC may be provided between the program command 80$h$ and the program data W-data. Address to data loading time tADL is the time from inputting a row address to inputting data. The target latch command TLC may not be a command separate from a program command 80$h$ but a command included in the program command 80$h$. That is, the target latch command TLC and the program command 80$h$ may be combined as a single command. Alternatively, the target latch manager 1165 may initialize a target latch corresponding to data in response to the program command 80$h$ before all program unit data are input. The target latch manager 1165 may initialize the target latch value with reference to the column addresses C1 and C2 and the row address R1, R2, and R3 corresponding to input data without a separate command before receiving all input data. For example, the target latch manager 1165 may combine the column addresses C1 and C2 and the row address R1, R2, and R3 to determine a type of input data and initialize a target latch corresponding to the input data before receiving all input data.

Referring to FIGS. 3 to 6, the nonvolatile memory device 1100 may sequentially receive the program command 80$h$, the target latch command TLC, the column addresses C1 and C2 and the row addresses R1, R2, and R3 corresponding to a first page from the memory controller 1200. However, the order of the commands and the addresses are not limited to that in FIG. 6. When the first page is to be an LSB page, LSB data that is first data is provided to the data input/output circuit 1140 after the row addresses R1, R2, and R3 are provided to the nonvolatile memory device 1100. The cache latch 1135 is initialized in response to the program command 80$h$. That is, the cache latch 1135 is initialized before the LSB data is provided. The target latch manager 1165 initializes the LSB latch 1132, which is a target latch, considering a size of input data before LSB data of a single page are all input. Thus, the target latch manager 1165 may reduce program time by initializing the LSB latch 1132 while the first data is input, during the first initialization period. The target latch manager 1165 transmits the received first data to the LSB latch 1132, in the first data dump period, before receiving all the first data. Thus, a first data transmission period overlaps with a period in which a second page program command 80*h* is provided and a period in which the first data is inputted. The nonvolatile memory device 1100 receives the second page program command 80*h* to perform a second page program operation. The nonvolatile memory device 1100 sequentially receives the target latch command TLC and the column addresses C1 and C2 and the row addresses R1, R2, and R3 corresponding to a second page. However, the order of the commands and addresses is not limited to that in FIG. 6. The cache latch 1135 is initialized in response to the second page program command 80*h* or the target latch command TLC. Thus, the cache latch 1135 may be initialized in a period in which second data addresses are provided and a period in which the first data is transmitted. Similar to the above, the CSB latch 1133 is initialized after an address is provided.

More specifically, the nonvolatile memory device 1100 may sequentially receive the program command 80*h*, the target latch command TLC, the column addresses C1 and C2 and the row addresses R1, R2, and R3 corresponding to a second page from the memory controller 1200. However, the order of the commands and the addresses are not limited to that in FIG. 6. When the second page is to be a CSB page, CSB data that is second data is provided to the data input/output circuit 1140 after the row addresses R1, R2, and R3 are provided to the nonvolatile memory device 1100. The cache latch 1135 is initialized in response to the program command 80*h*. That is, the cache latch 1135 is initialized before the CSB data is provided. The target latch manager 1165 initializes the CSB latch 1133, which is a target latch, considering a size of input data before CSB data of a single page are all input. Thus, the target latch manager 1165 may reduce program time by initializing the CSB latch 1133 while the second data is input, during the second initialization period. The target latch manager 1165 transmits the received second data to the CSB latch 1133, in the second data dump period, before receiving all the second data. Thus, a second data transmission period overlaps with a period in which a third page program command 80*h* is provided and a period in which the second data is inputted. The nonvolatile memory device 1100 receives the third page program command 80*h* to perform a third page program operation. The nonvolatile memory device 1100 sequentially receives the target latch command TLC and the column addresses C1 and C2 and the row addresses R1, R2, and R3 corresponding to a third page. However, the order of the commands and addresses is not limited to that in FIG. 6. The cache latch 1135 is initialized in response to the third page program command 80*h* or the target latch command TLC. Thus, the cache latch 1135 may be initialized in a period in which third data addresses are provided and a period in which the third data is transmitted. Similar to the above, the MSB latch 1134 is initialized after an address is provided.

More specifically, the nonvolatile memory device 1100 may sequentially receive the program command 80*h*, the target latch command TLC, the column addresses C1 and C2 and the row addresses R1, R2, and R3 corresponding to a third page from the memory controller 1200. However, the order of the commands and the addresses are not limited to that in FIG. 6. When the third page is to be an MSB page, MSB data that is third data is provided to the data input/output circuit 1140 after the row addresses R1, R2, and R3 are provided to the nonvolatile memory device 1100. The cache latch 1135 is initialized in response to the program command 80*h*. That is, the cache latch 1135 is initialized before the MSB data is provided. The target latch manager 1165 initializes the MSB latch 1134, which is a target latch, considering a size of input data before MSB data of a single page are all input. Thus, the target latch manager 1165 may reduce program time by initializing the MSB latch 1134 while the third data is input, during the third initialization period. The target latch manager 1165 transmits the received third data to the MSB latch 1134, in the third data dump period, before receiving all the third data. Thus, a third data transmission period overlaps with a period in which the third data is inputted.

Figure 7:
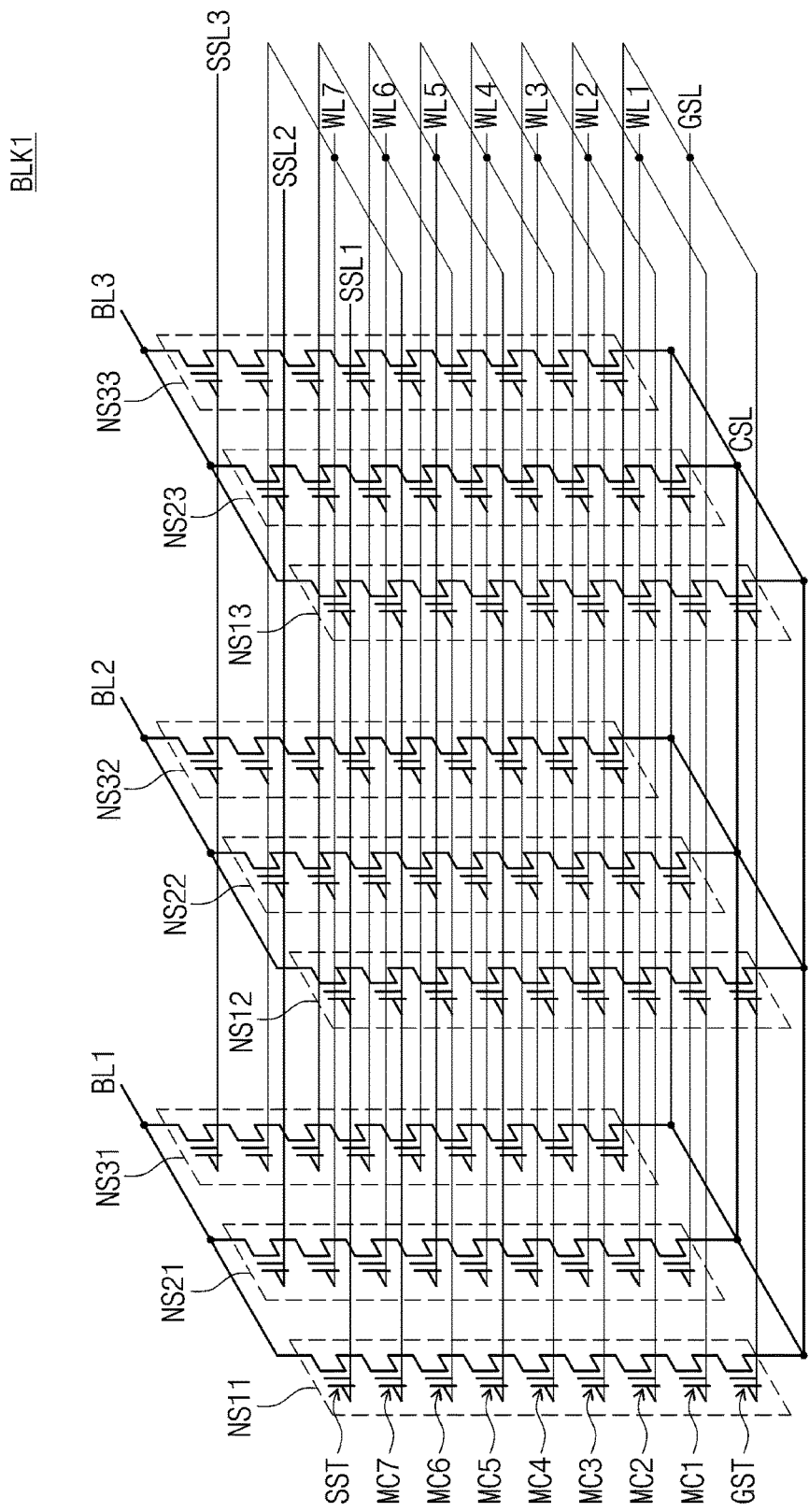
FIG. 7 is an equivalent circuit diagram of the memory block in FIG. 7.

FIG. 7 is an equivalent circuit diagram of the memory block BLK1 in FIG. 3.

Referring to FIG. 7, NAND strings NS11 to NS33 are coupled between bitlines BL1 to BL3 and a common source line CSL. Each NAND string (e.g., NS11) includes a string selection transistor SST, a plurality of memory cells MC1 to MC7, and a ground selection transistor GST.

A string selection transistor SST is connected to string selection lines SSL1 to SSL3. A plurality of memory cells MC1 to MC7 are connected to wordlines WL1 to WL7, respectively. A ground selection transistor GST is connected to a ground selection line GSL. A string selection transistor SST is connected to a bitline BL and a ground selection transistor GST is connected to a common source line CSL.

Still referring to FIG. 7, the string selection lines SSL1 to SSL3 are separated from each other. Wordlines (e.g., WL1) of the same height may be connected in common. When memory cells that are connected to a first wordline WL1 and belong to NAND strings NS11, NS12, and NS13 are programmed, the first wordline WL1 and the first selection line SSL1 may be selected.

Figure 8:
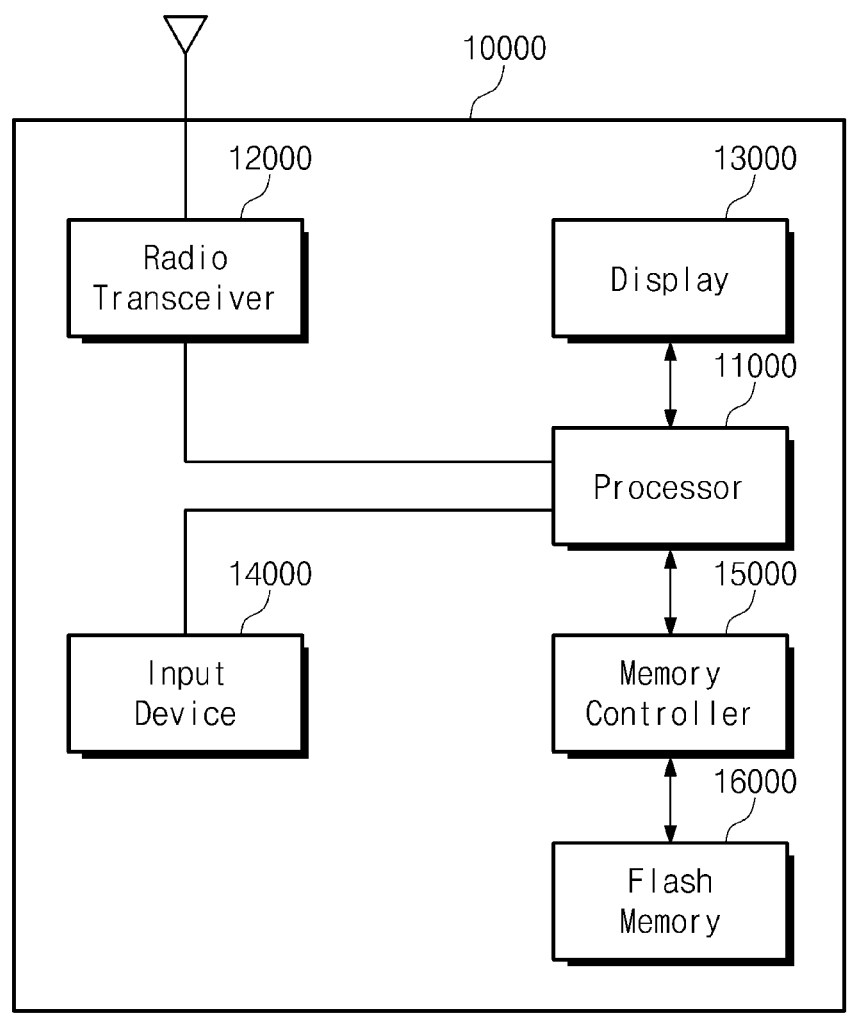
FIG. 8 is a block diagram of an electronic device including a memory controller and a nonvolatile memory device according to example embodiments of disclosure.

FIG. 8 is a block diagram of an electronic device 10000 including a memory controller and a nonvolatile memory device according to example embodiments of disclosure.

Referring to FIG. 8, the electronic device 10000 such as a cellar phone, a smartphone, and a table PC may include a nonvolatile memory device 16000 and a memory controller 15000 configured to control the operation of the nonvolatile memory device 16000.

The nonvolatile memory device 16000 may refer to the nonvolatile memory device 1100 illustrated in FIG. 1. The nonvolatile memory device 16000 may store random data. The memory controller 15000 may be controlled by a processor 11000 that controls the overall operation of the electronic device 10000. Data stored in the nonvolatile memory device 16000 may be displayed through a display 13000 according to a control of the memory controller 15000 that operates according to the control of the processor 11000. A radio transceiver 12000 may exchange a radio signal through an antenna. For example, the radio transceiver 12000 may convert a radio signal received through the antenna into a signal that the processor 11000 may process. Thus, the processor 11000 may process a signal from the radio transceiver 12000 and store the processed signal in the nonvolatile memory device 16000 or display the processed signal through the display 13000. The radio transceiver 12000 may convert a signal output from the processor 11000 into a radio signal and output the converted signal to an external entity through the antenna. An input device 14000 is a device that may receive a control signal to control operation of the processor 11000 or input data to be processed by the processor 11000. The input device 14000 may be implemented with a pointing device such as a touchpad or a computer mouse, a keypad or a keyboard.

The processor 11000 may control the display 13000 such that data output from the nonvolatile memory device 16000, a radio signal output from the radio transceiver 12000 or data from the input device 14000 is displayed through the display 13000.

Figure 9:
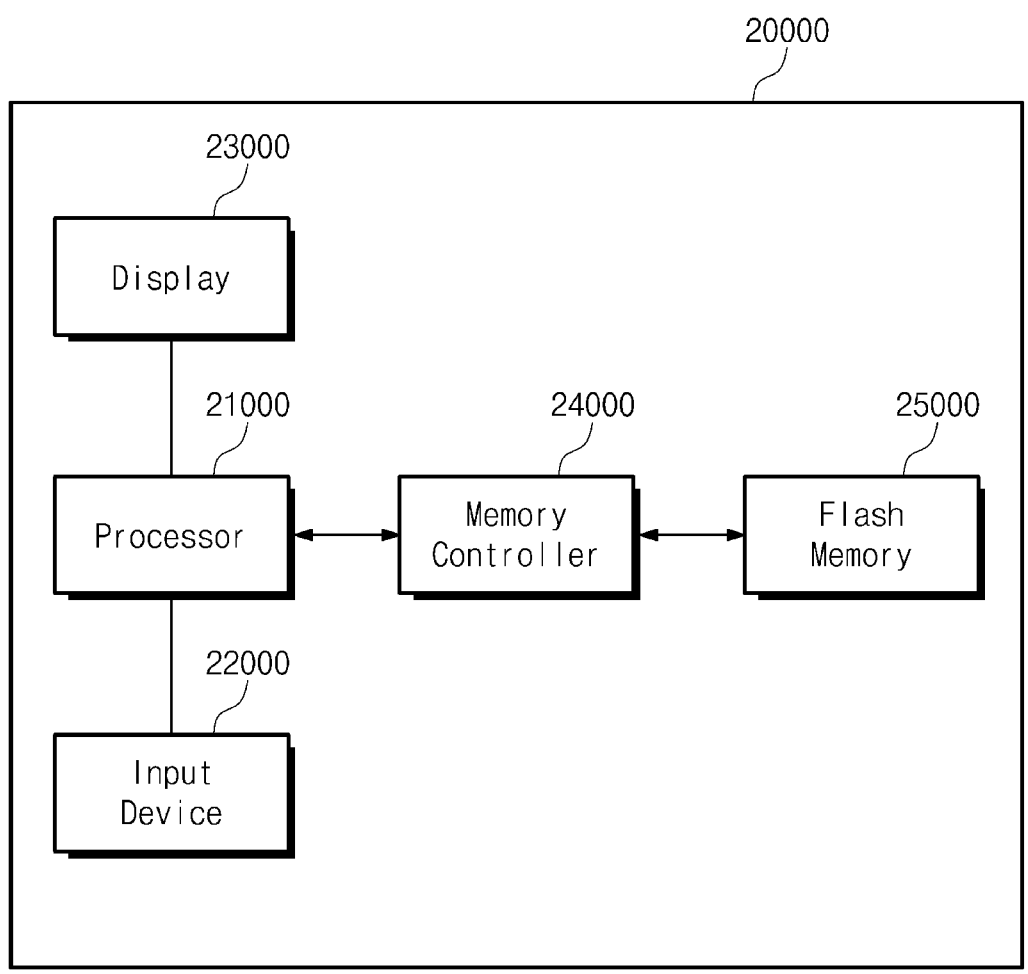
FIG. 9 is a block diagram of an electronic device including a memory controller and a nonvolatile memory device according to example embodiments of disclosure.

FIG. 9 is a block diagram of an electronic device 20000 including a memory controller and a nonvolatile memory device according to example embodiments of disclosure. Referring to FIG. 9, the electronic device 20000 may be implemented with a data processing device such as a personal computer (PC), a tablet computer, a net-book, an e-reader, a personal digital assistant (PDA), a portable multimedia player (PMP), an MP3 player, and an MP4 player. The electronic device 20000 may include a nonvolatile memory device 25000 such as a flash memory device and a memory controller 24000 configured to control operation of the nonvolatile memory device 25000.

The nonvolatile memory device 25000 may refer to the nonvolatile memory device shown in FIGS. 1 and 3. The electronic device 20000 may include a processor 21000 that controls the overall operation of the electronic device 20000. The memory controller 24000 is controlled by the processor 21000. The processor 21000 may display data stored in the nonvolatile memory device 25000 through a display 23000 according to an input signal generated by an input device 22000. For example, the input device 22000 may be implemented with a pointing device such as a touchpad and a computer mouse, a keypad or a keyboard.

Figure 10:
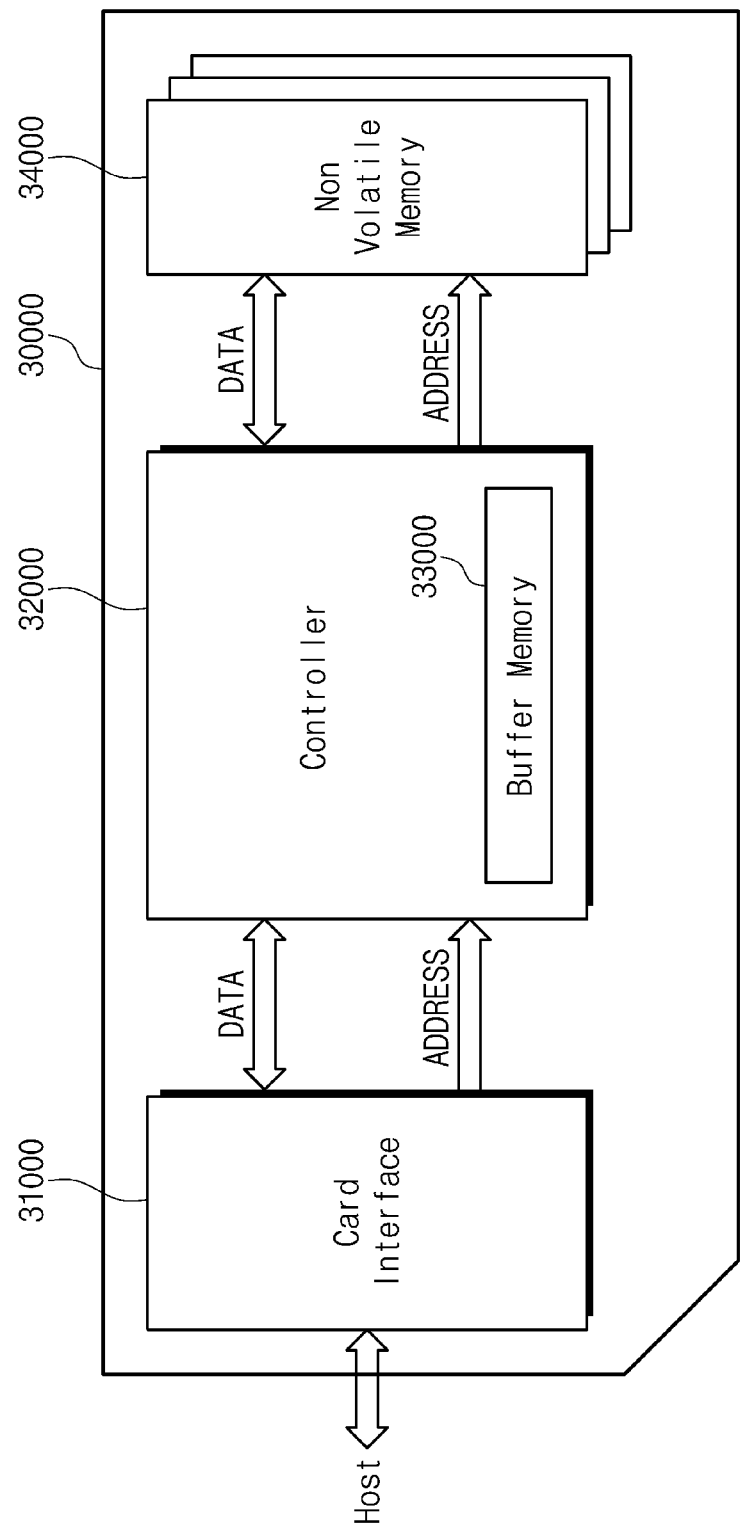
FIG. 10 is a block diagram of an electronic device including a memory controller and a nonvolatile memory device according to example embodiments of disclosure.

FIG. 10 is a block diagram of an electronic device including a memory controller and a nonvolatile memory device 30000 according to example embodiments of disclosure. As illustrated, the electronic device 30000 may include a card interface 31000, a memory controller 32000, and a nonvolatile memory device 34000 (e.g., flash memory device). The electronic device 30000 may exchange data with a host through the card interface 31000. The card interface 31000 may be a secure digital (SD) card interface or a multimedia card (MMC) interface. However, disclosure is not limited thereto. The card interface 31000 may interface data exchange between the host and the memory controller 32000 according to the communication protocol of the host capable of communicating with the electronic device 30000. The memory controller 32000 may control the overall operation of the electronic device 30000 and control data exchange between the card interface 31000 and the nonvolatile memory device 34000. A buffer memory 33000 of the memory controller 32000 may buffer data exchanged between the card interface 31000 and the nonvolatile memory device 34000. The memory controller 32000 is connected to the card interface 31000 and the nonvolatile memory device 34000 through a data bus DATA and an address bus ADDRESS. In example embodiments, the memory controller 32000 may receive an address of data desired to be read or written from the card interface 31000 through the address bus ADDRESS and transmit the received address of data to the nonvolatile memory device 34000. The memory controller 32000 may receive or transmit the data desired to be read or written through the data bus DATA connected to the card interface 31000 or the nonvolatile memory device 34000. The nonvolatile memory device 34000 may refer to the nonvolatile memory device illustrated in FIG. 1. The memory controller 32000 may be the memory controller illustrated in FIG. 1. The nonvolatile memory device 16000 may store random data.

When the electronic device 30000 is connected to a host such as a PC, a tablet PC, a digital camera, a digital audio player, a mobile phone, console video game hardware or a digital set-top box, the host may exchange data stored in the nonvolatile memory device 34000 through the card interface 31000 and the memory controller 32000.

Figure 11:
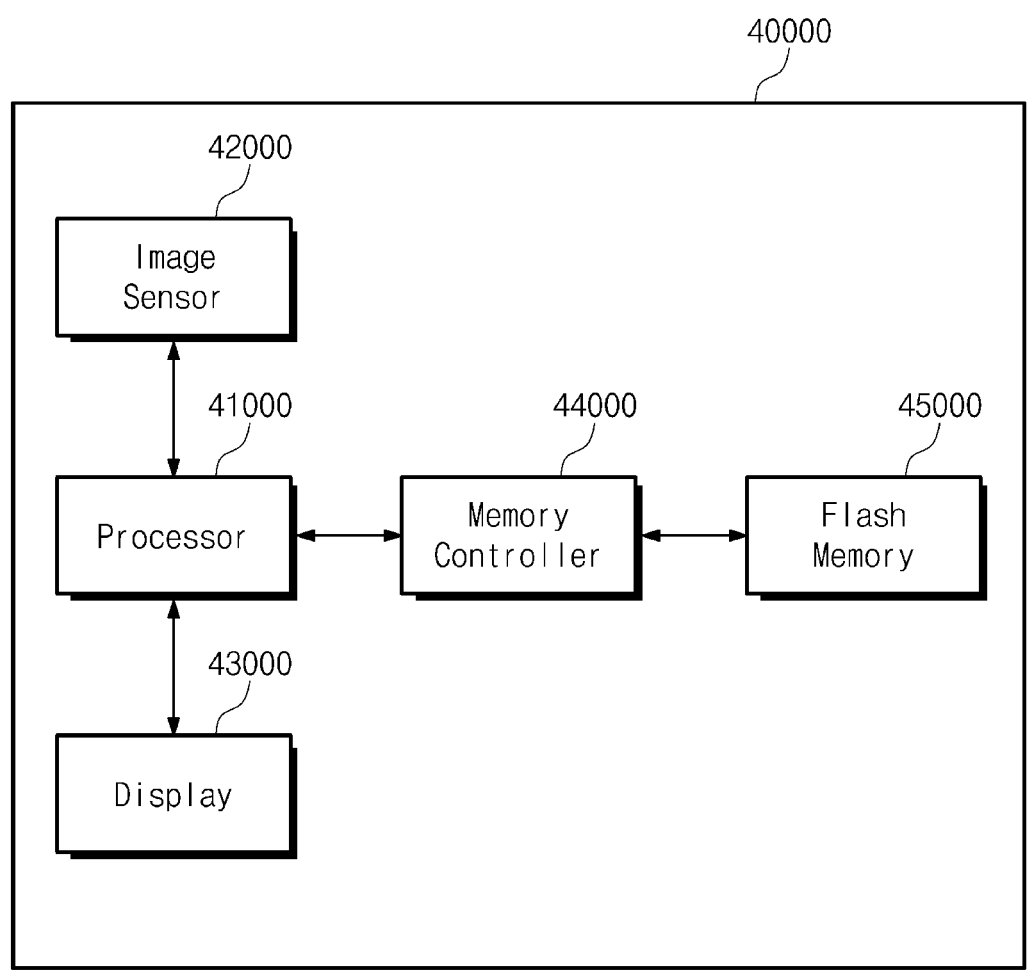
FIG. 11 is a block diagram of an electronic device including a memory controller and a nonvolatile memory device according to example embodiments of disclosure.

FIG. 11 is a block diagram of an electronic device 40000 including a memory controller and a nonvolatile memory device according to example embodiments of disclosure. As illustrated, the electronic device 40000 may include a nonvolatile memory device 45000 such as flash memory device, a memory controller 44000 configured to control a data processing operation of the nonvolatile memory device 45000, and a processor 41000 configured to control the overall operation of the electronic device 40000.

The nonvolatile memory device 45000 may refer to a nonvolatile memory device illustrated in FIGS. 1 and 3. An image sensor 42000 of the electronic device 40000 may convert an optical signal into a digital signal, and the converted digital signal may be stored in the nonvolatile memory device 45000 under the control of the processor 41000. The digital signal stored in the nonvolatile memory device 45000 may be displayed through a display 43000 under the control of the processor 41000.

Figure 12:
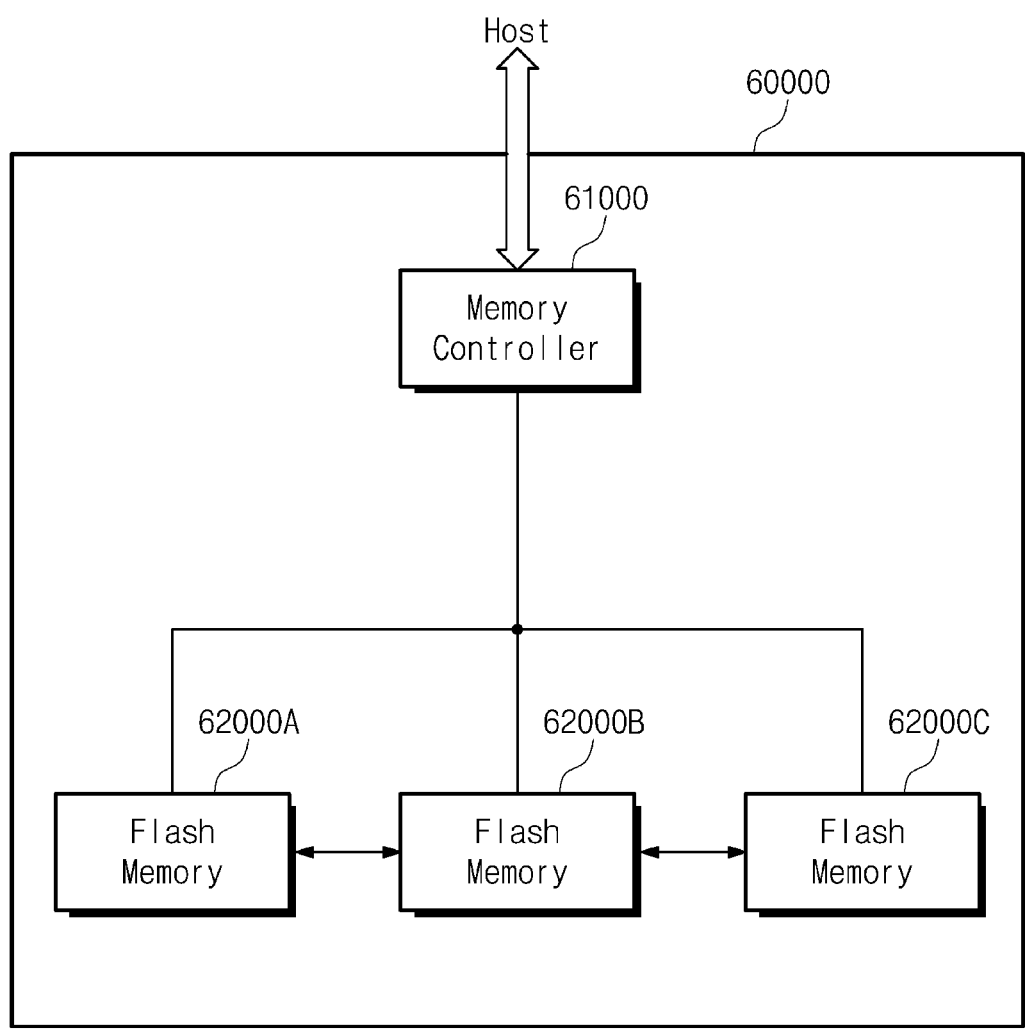
FIG. 12 is a block diagram of an electronic device including a memory controller and nonvolatile memory devices according to example embodiments of disclosure.

FIG. 12 is a block diagram of an electronic device 60000 including a memory controller and nonvolatile memory devices according to example embodiments of disclosure. As illustrated, the electronic device 60000 may include a plurality of nonvolatile memory devices 62000A, 62000B, and 62000C and a memory controller 61000 configured to control a data processing operation of each of the nonvolatile memory devices 62000A, 62000B, and 62000C.

The electronic device 60000 may be implemented with a memory system or a memory module.

The nonvolatile memory devices 62000A, 62000B, and 62000C may refer to the nonvolatile memory device illustrated in FIGS. 1 and 3. The nonvolatile memory devices 62000A, 62000B, and 62000C may store random data. In example embodiments, the memory controller 61000 may be implemented inside or outside the electronic device 60000.

Figure 13:
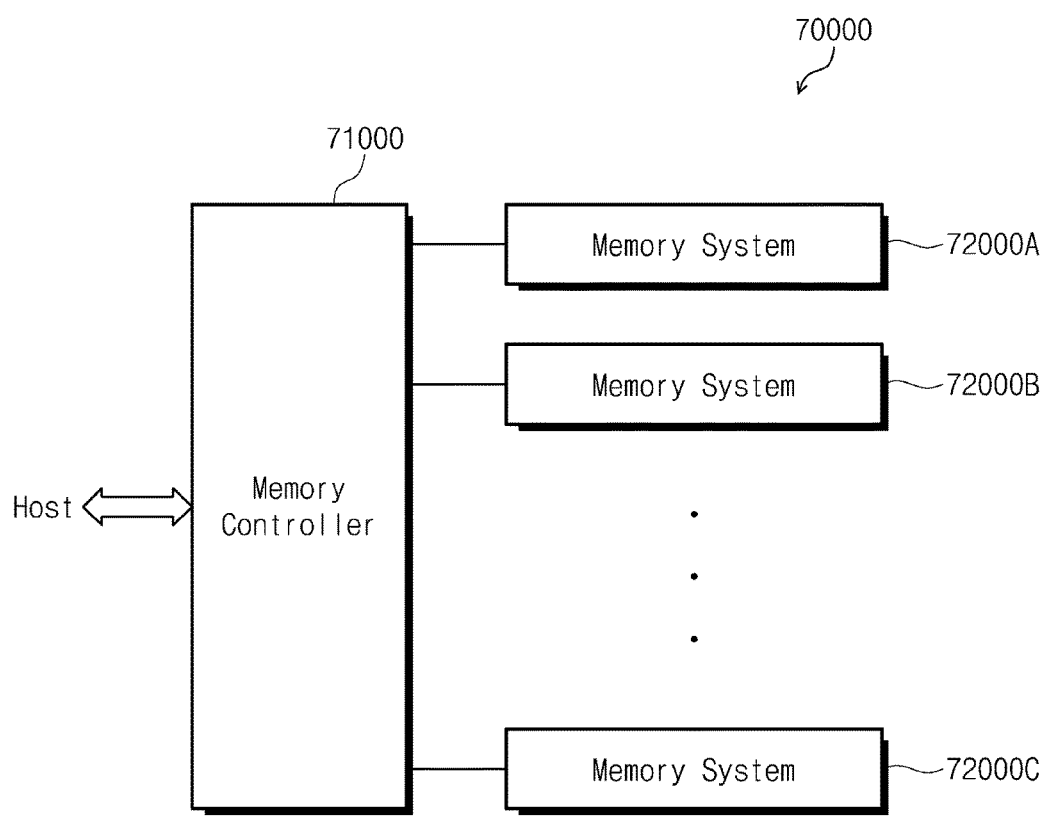
FIG. 13 is a block diagram of a data processing system including the electronic device illustrated in FIG. 12.

FIG. 13 is a block diagram of a data storage device 70000. Referring to FIG. 13, the data storage device 70000 may be implemented with a redundant array of independent disks (RAID) system. The data storage system 70000 may include a RAID controller 71000 and a plurality of memory systems 72000A and 72000B to 72000C (C being a positive integer). Each of the memory systems 72000A and 72000B to 72000C may be the flash memory 1100 illustrated in FIG. 1. The memory systems 72000A and 72000B to 72000C may constitute a RAID array. The data storage device 70000 may be implemented with a personal computer (PC) or a solid state drive (SSD). During a program operation, the RAID controller 71000 may output program data output from a host to one of the memory systems 72000A and 72000B to 72000C according to one selected from a plurality of RAID levels based on RAID level information output from the host. During a read operation, the RAID controller 71000 may transmit data read from one of the memory systems 72000A and 72000B to 72000C to the host according to one selected from a plurality of RAID levels based on RAID level information output from the host.

As described above, an error occurrence probability may be reduced during a program operation and data reliability may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above-disclosed subject matter is to be considered illustrative, and not restrictive, and the appended claims are intended to cover all such modifications, enhancements, and other features, which fall within the true spirit and scope of disclosure. Thus, to the maximum extent allowed by law, the scope of disclosure is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
    a nonvolatile memory cell array including memory cells, each storing N bits, N being an integer greater than or equal to 2;
    a page buffer circuit electrically connected to the nonvolatile memory cell array, the page buffer circuit including at least N latches and a cache latch configured to temporarily store data;
    a data input/output circuit connected to the page buffer circuit and configured to receive input data to be programmed, which includes first to N-th page data, and to provide the input data to the cache latch of the page buffer circuit; and
    a control logic configured to control the page buffer circuit to:
        initialize a target latch, among the N latches, based on a first target latch command and first address information pertaining to the first page data that are received by the control logic,
        receive the first page data in the cache latch,
        transfer the first page data from the cache latch to the target latch while the control logic receives a second target latch command and second address information pertaining to second page data,
        complete transferring the first page data to the target latch before the control logic completely receives the second address information, and
        program the first page data from the target latch to the nonvolatile memory cell array.

2. The nonvolatile memory device as set forth in claim 1, further comprising a target latch manager configured to initialize the target latch in response to a target latch command before the cache latch completely receives the first page data.

3. The nonvolatile memory device as set forth in claim 2, wherein the target latch manager transmits the first page data to the target latch after the cache latch receives the first page data.

4. The nonvolatile memory device as set forth in claim 1, further comprising a target latch manager configured to initialize the target latch with reference to a column address and a row address, corresponding to the first page data, before the cache latch completely receives the first page data.

5. The nonvolatile memory device as set forth in claim 1, wherein the cache latch is configured to be initialized in response to a program command and before the target latch is initialized.

6. The nonvolatile memory device as set forth in claim 1, wherein the first page data is least significant bit (LSB) data and the target latch is an LSB latch.

7. The nonvolatile memory device as set forth in claim 1, wherein the first page data is center significant bit (CSB) data and the target latch is a CSB latch.

8. The nonvolatile memory device as set forth in claim 1, wherein the first page data is most significant bit (MSB) data and the target latch is an MSB latch.

9. The nonvolatile memory device as set forth in claim 1, wherein each of the first to N-th page data constitutes 16 Kbytes.

10. The nonvolatile memory device as set forth in claim 9, wherein the control logic initializes the target latch when the first page data of 15.8 Kbytes is received.

11. The nonvolatile memory device as set forth in claim 1, wherein the nonvolatile memory cell array has a three-dimensional structure in which the memory cells are vertically stacked on a substrate.

12. A nonvolatile memory device comprising:
    a memory cell array comprising a plurality of memory cells;
    a page buffer circuit that temporarily stores data received from a memory controller and transfers the data to the memory cell array, the page buffer circuit comprising a cache latch, a first latch, and a second latch; and
    a control circuit that controls operations of the memory cell array and the page buffer circuit, wherein:
    the control circuit controls the page buffer circuit to:
        receive first page data in the cache latch, the first page data pertaining to a first target latch command and first address information received by the control circuit,
        transfer the first page data from the cache latch to a first target latch, among the first latch and the second latch, while the control circuit receives a second target latch command and second address information pertaining to second page data,
        complete transferring the first page data to the first target latch before the control circuit completely receives the second address information, and
        program the first page data from the first target latch to the memory cell array.

13. The nonvolatile memory device of claim 12, wherein the first target latch command identifies the first latch as the first target latch.

14. The nonvolatile memory device of claim 12, wherein the control circuit controls the page buffer circuit to:
    receive the second page data in the cache latch, and transfer the second page data stored in the cache latch to a second target latch, among the first latch and the second latch, while the control circuit receives a third target latch command from the memory controller.

15. The nonvolatile memory device of claim 14, wherein the second target latch command identifies the second latch as the second target latch.

16. The nonvolatile memory device of claim 14, wherein the control circuit controls the page buffer circuit to program information identifying both the first data stored in the first latch and second data stored in the second latch within one of the memory cells identified by an address provided by each of the first and second target latch commands.

17. A nonvolatile memory device comprising:
  a memory cell array comprising a plurality of memory cells;
  a page buffer circuit that temporarily stores data received data from a memory controller and transfers the data to the memory cell array, the page buffer circuit comprising a cache latch, a first latch, and a second latch; and
  a control circuit that controls operations of the memory cell array and the page buffer circuit, wherein
  the control circuit controls the page buffer circuit to:
    initialize a first target latch, among the first latch and the second latch, based on a first target latch command and first address information pertaining to first page data that are received by the control circuit,
    receive the first page data in the cache latch,
    transfer the first page data from the cache latch to the first target latch while the control circuit receives a second target latch command and second address information pertaining to second page data,
    complete transferring the first page data to the first target latch before the control circuit completely receives the second address information, and
    program the first page data from the first target latch to the memory cell array.

18. The nonvolatile memory device of claim 17, wherein the control circuit controls the page buffer circuit to:
  receive the second page data in the cache latch, and
  transfer the second page data stored in the cache latch to a second target latch, among the first latch and the second latch, while the control circuit receives a third target latch command from the memory controller.

19. The nonvolatile memory device of claim 17, wherein the control circuit controls the page buffer circuit to program information identifying both the first data stored in the first latch and second data stored in the second latch within one of the memory cells identified by an address provided by each of the first and second target latch commands.

* * * * *